United States Patent
Carneiro et al.

(10) Patent No.: US 6,515,331 B1
(45) Date of Patent: Feb. 4, 2003

(54) MOSFET STRUCTURE FOR USE IN ESD PROTECTION DEVICES

(75) Inventors: Manuel Carneiro, San Jose, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/617,420

(22) Filed: Jul. 17, 2000

(51) Int. Cl.⁷ ............ H01L 29/76; H01L 29/94; H01L 31/062; H01L 31/113; H01L 31/119
(52) U.S. Cl. .................. 257/336; 257/408
(58) Field of Search .................. 257/288, 350, 257/355, 336, 367, 344, 339, 401, 408, 481, 603

(56) References Cited

U.S. PATENT DOCUMENTS

| | | | | |
|---|---|---|---|---|
| 5,534,723 A | * | 7/1996 | Iwai et al. ............ | 257/360 |
| 5,708,288 A | * | 1/1998 | Quigley et al. ......... | 257/355 |
| 6,222,236 B1 | * | 4/2001 | Lamey ............... | 257/355 |
| 6,239,472 B1 | * | 5/2001 | Shenoy .............. | 257/408 |

OTHER PUBLICATIONS

Sze, S.M., *VLSI Technology, Second Edition*, McGraw Hill, 1988, pp. 648–650.
Amerasekera, A. et al., *ESD in Silicon Integrated Circuits*, John Wiley & Sons, 1995, pp. 47–49, 69–72, 194–195.

* cited by examiner

*Primary Examiner*—David Nelms
*Assistant Examiner*—David Nhu
(74) *Attorney, Agent, or Firm*—Mark C. Pickering

(57) ABSTRACT

A MOSFET structure for use in an ESD protection device that includes a semiconductor substrate (e.g., a silicon substrate) of a first conductivity type with a gate insulation layer (e.g., a gate silicon dioxide layer) thereon. A patterned gate layer overlies the gate insulation layer, source and drain regions of a second conductivity type are disposed in the semiconductor substrate, and an LDD source extension region of the second conductivity type is located adjacent to the source region. Furthermore, a channel region of the first conductivity type is disposed underneath the gate insulation layer and extends from the LDD source extension region to the drain region. The absence of an LDD drain extension region, combined with the presence of an LDD source extension region, provides for superior snap-back performance (i.e., a relatively low first breakdown voltage and a relatively low holding voltage). A method for manufacturing an MOSFET structure for use in ESD protection devices includes steps of first providing a semiconductor substrate (e.g., a silicon substrate) with a gate insulation layer thereon, followed by the formation of a patterned gate layer on the gate insulation layer. Next, dopant atoms (e.g., phosphorus) are implanted into the semiconductor substrate to form an LDD source extension region. The dopant atoms are implanted using an implant mask that prevents dopant atom implantation into the semiconductor substrate adjacent to where a drain region of the MOSFET structure will be subsequently formed.

14 Claims, 3 Drawing Sheets

MOSFET STRUCTURE FOR USE IN ESD PROTECTION DEVICES

BACKGROUND OF THE INVENTION

1. Field of the Invention

The present invention relates to semiconductor devices and, in particular, to metal-oxide-semiconductor field effect transistors (MOSFET) devices for use in electrostatic discharge (ESD) protection devices and methods for their manufacture.

2. Description of the Related Art

Electrostatic discharge (ESD) protection devices are commonly employed in an integrated circuit (IC) to protect electronic devices in the IC from spurious pulses of excessive voltage (namely, an "ESD event"). See, for example, S. M. Sze, *VLSI Technology, Second Edition*, 648–650 (McGraw Hill, 1988). A variety of conventional ESD protection devices that make extensive use of diodes, metal-oxide-semiconductor field effect transistors (MOSFETs) and bipolar transistors are known in the field.

Referring to FIG. 1, a representative conventional MOSFET structure 10 for use in an ESD protection device is illustrated. The MOSFET structure 10 includes a gate silicon dioxide layer 12 overlying P-type silicon substrate 14. Also present in the P-type silicon substrate 14 are N-type source region 16 and N-type drain region 18. N-type Lightly-Doped-Drain (LDD) source extension region 20 and N-type LDD drain extension region 22 are disposed in the P-type silicon substrate 14 underneath gate silicon dioxide layer 12 and adjacent to the N-type source region 16 and N-type drain region 18, respectively. In addition, channel region 24 is located in the P-type silicon substrate 14 and connects the N-type LDD source extension region 20 to the N-type LDD drain extension region 22 underneath the gate silicon dioxide layer 12. A patterned polysilicon gate layer 28 overlies gate silicon dioxide layer 12. Gate sidewall spacer 26, typically of silicon dioxide or silicon nitride, is formed on the edges of the patterned polysilicon gate layer 28 and gate silicon dioxide layer 12.

Conventional MOSFET structures are designed to exhibit breakdown characteristics only at voltages well above their standard operating supply voltage. However, during an ESD event, MOSFET structures used in ESD protection devices exhibit significant current conduction via a parasitic lateral bipolar mechanism. For a further description of such current conduction in MOSFET structures via a parasitic lateral bipolar mechanism, see sections 3.5.2 and 4.2.3 of Ajith Amerasekera and Charvaka Duvvury, *ESD in Silicon Integrated Circuits*, 47–49, 69–72 (John Wiley & Sons 1995), which are hereby fully incorporated by reference.

FIG. 2 is a graph illustrating the typical current versus voltage characteristics (using arbitrary axes) of a conventional grounded-gate NMOSFET structure for use in an ESD protection device. An electrical schematic illustrating the conventional NMOSFET structure 10 of FIG. 1 in a grounded-gate configuration is provided in FIG. 3. The current versus voltage characteristics of FIG. 2 are representative of a 50 micron wide grounded-gate NMOSFET structure operating in the voltage range of 0 to 10 volts and the current range of 0 amp to 1 amp. In Region 1, the grounded-gate NMOSFET structure behaves as a standard MOS transistor device with a relatively low level of leakage current. In Region 2, the grounded-gate NMOSFET is in the operating regime known as the first breakdown region. Region 3 represents the operating regime, where the N-type source region of the grounded-gate NMOSFET structure is being forward biased, thereby initiating current conduction through a parasitic lateral bipolar mechanism.

The transition point between Region 2 and Region 3 is the "first breakdown" point, where the grounded-gate NMOSFET structure triggers into "snap-back." The transition point is characterized by its trigger voltage ($V_{t1}$) and trigger current ($I_{t1}$). Region 4 represents the snap-back region, wherein the grounded-gate NMOSFET structure behaves as if it were a pure lateral bipolar transistor. The "holding voltage" of a grounded-gate NMOSFET structure can be determined by extrapolating Region 4 to the voltage axis using a linear scale graph.

It is desirable that MOSFET structures for use in ESD protection devices have a relatively low first breakdown point (i.e., relatively low $V_{t1}$) to facilitate their transition into current conduction through a parasitic lateral bipolar mechanism. It is also desirable for such MOSFET structures to have a relatively low holding voltage, in order to lower their power dissipation, thereby increasing their ESD event survival expectancy.

The net dopant level in the N-type LDD drain extension region can be decreased to provide a more abrupt junction and thereby relatively low first breakdown voltage. However, since the N-type LDD source extension region and the N-type LDD drain extension region are formed simultaneously in conventional MOSFET structures, decreasing the net dopant level in the N-type LDD drain extension region simultaneously decreases the dopant level in the N-type LDD source extension region. Unfortunately, a decrease in the dopant level of the N-type LDD source extension region often results in an undesirable increase in the holding voltage, rather than the desired decrease in the holding voltage.

Still needed in the field, therefore, is a MOSFET structure for use in ESD devices that provides both a relatively low first breakdown point and a relatively low holding voltage.

SUMMARY OF THE INVENTION

The present invention provides a MOSFET structure for use in ESD protection devices that has both superior snap-back performance (i.e., a relatively low first breakdown voltage) and superior ESD event survival expectancy resulting from its relatively low holding voltage. These benefits of the present invention are attained by employing an LDD extension region that is adjacent only to the source region of the MOSFET structure (i.e., an LDD source extension region), without employing an LDD extension region adjacent to the drain region of the MOSFET structure. In other words, the conventional LDD drain extension region is absent in MOSFET structures for use in ESD protection devices according to the present invention.

The superior snap-back performance of MOSFET structures in accordance with the present invention is due to the junction between the drain region and the channel region, in the absence of an LDD drain extension region, exhibiting an abrupt junction breakdown behavior at a relatively low first breakdown voltage ($V_{t1}$). In addition, the presence of an LDD source extension region reduces the source region barrier, thereby lowering the holding voltage and increasing ESD event survival expectancy.

MOSFET structures for use in an ESD protection device according to the present invention include a semiconductor substrate (e.g., a silicon substrate) of a first conductivity type (typically P-type) with a gate insulation layer (e.g., a gate silicon dioxide layer) disposed thereon. Also included are a patterned gate layer overlying the gate insulation layer, source and drain regions of a second conductivity type disposed in the semiconductor substrate and an LDD source extension region of the second conductivity type disposed in the semiconductor substrate adjacent to the source region. The MOSFET structure further includes a channel region of the first conductivity type disposed in the semiconductor substrate underneath the gate insulation layer and extending from the LDD source extension region to the drain region.

As described above, the absence of a LDD drain extension region combined with the presence of an LDD source extension region provides a MOSFET structure for use in an ESD protection device with a relatively low first breakdown voltage and a relatively low holding voltage.

Also provided is a method for manufacturing a MOSFET structure for use in ESD protection devices that includes steps of first providing a semiconductor substrate (e.g., a silicon substrate) with a gate insulation layer on its surface, followed by the formation of a patterned gate layer above the gate insulation layer. Next, dopant atoms (e.g., phosphorus atoms) are implanted into the semiconductor substrate to form an LDD source extension region. The dopant atoms are implanted using an implant mask (e.g., a patterned photoresist layer) that prevents dopant atom implantation into a region of the semiconductor substrate, where an LDD drain extension region would conventionally be formed (i.e., the region that will subsequently be adjacent to a drain region of the MOSFET structure). The method, therefore, provides for the simple and cost effective formation of an LDD source extension region in the absence of an LDD drain extension region.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

To be consistent throughout the present specification and for clear understanding of the present invention, the following definitions are hereby provided for terms used therein:

The terms "dopant" and "dopants" refer to donor and acceptor impurity atoms (e.g., boron [B], phosphorous [P], arsenic [As] and indium [In]), which are intentionally introduced into a semiconductor substrate (e.g., a silicon wafer) in order to change the substrate's charge-carrier concentration. See, R. S. Muller and T. I. Kamins, *Device Electronics for Integrated Circuits 2nd Edition*, 11–14 (John Wiley and Sons, 1986) for a further description of dopants.

Figure 1:
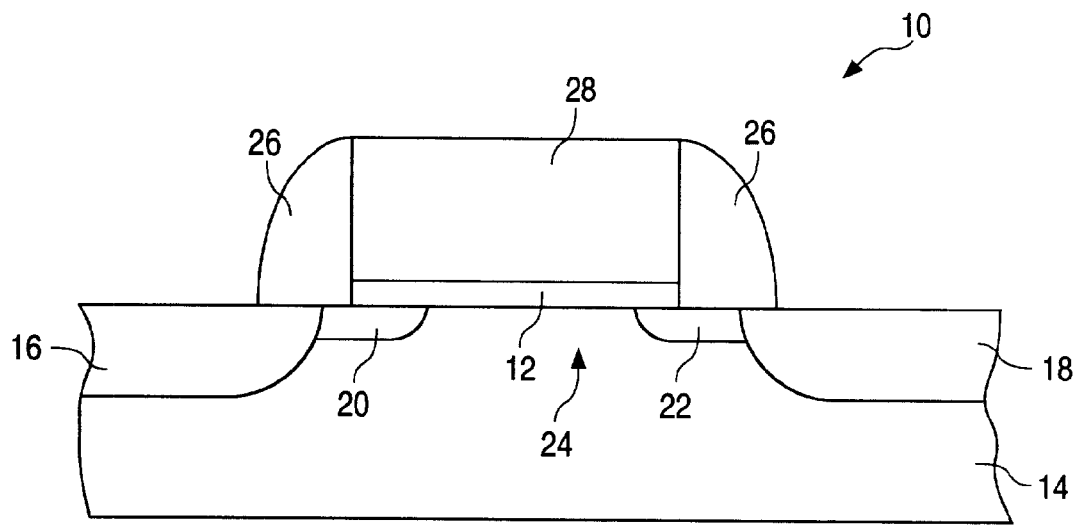
FIG. 1 is a side view of a conventional MOSFET structure for use in an ESD protection device.
Figure 3:
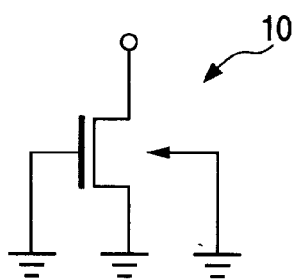
FIG. 3 is an electrical schematic illustrating a conventional MOSFET structure in a grounded-gate configuration.
Figure 4:
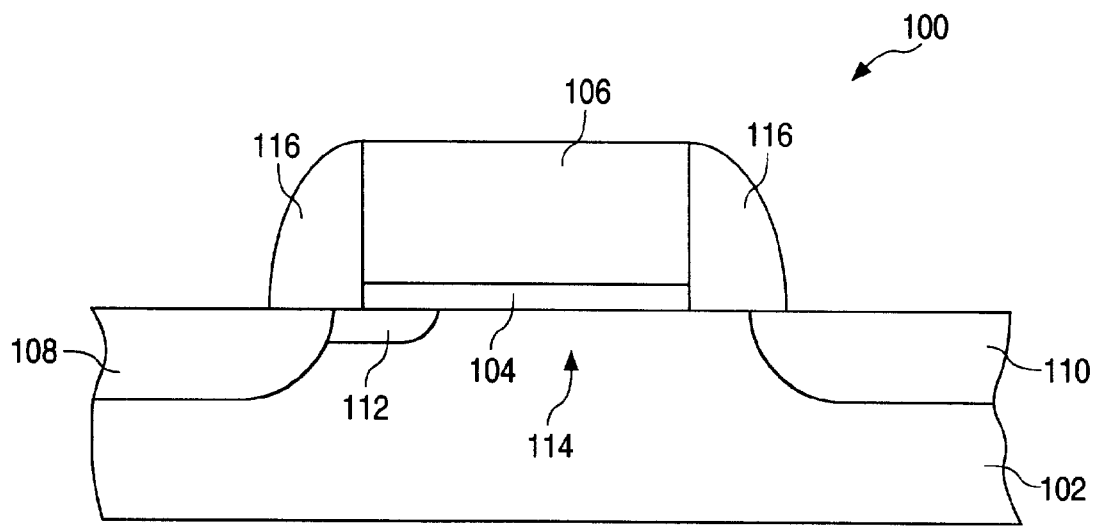
FIG. 4 is a cross-sectional representation of a MOSFET structure for use in an ESD protection device according to the present invention.
Figure 2:
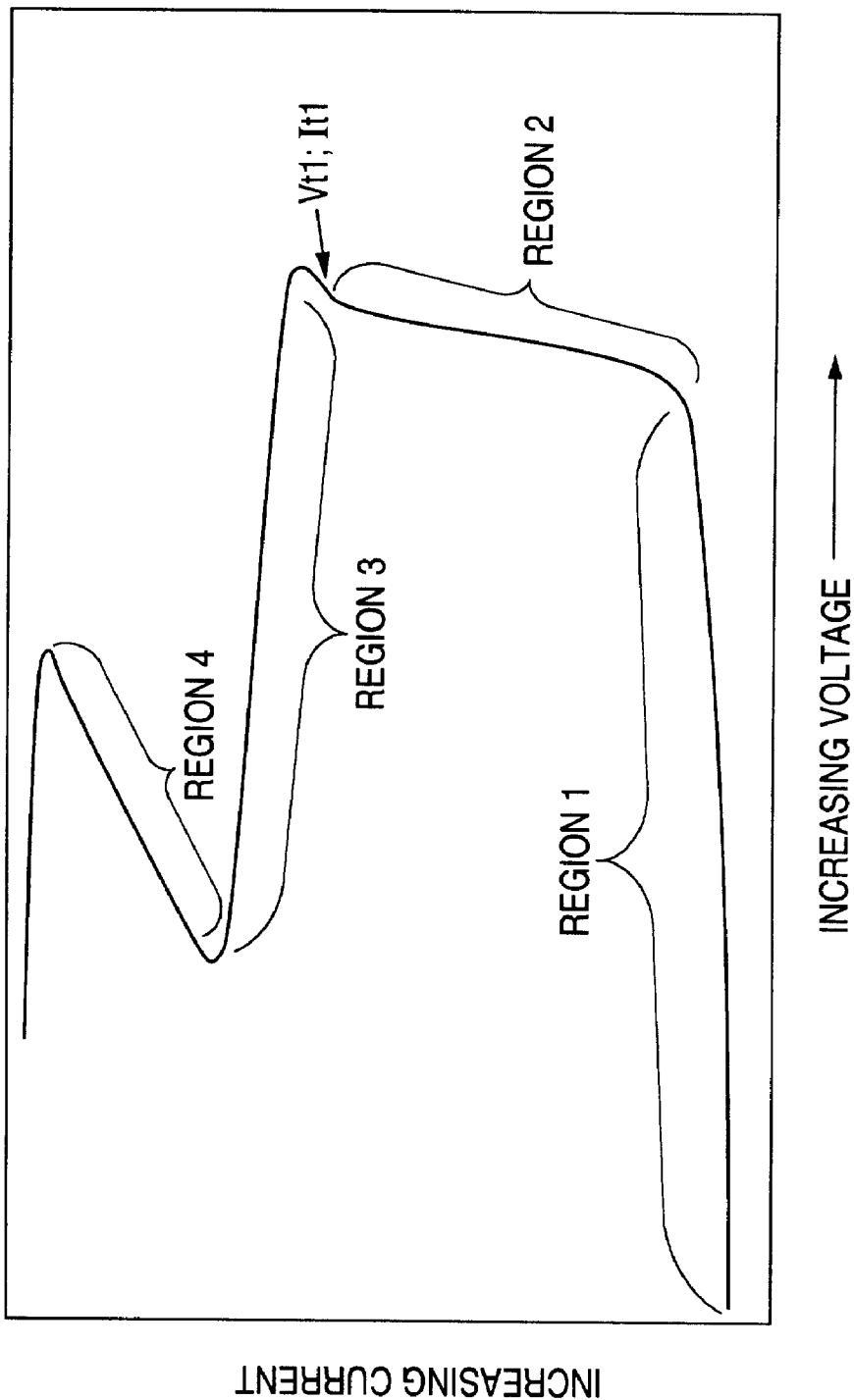
FIG. 2 is graph of current versus voltage illustrating the snap-back characteristics of a grounded-gate NMOSFET structure (i.e., a snap-back curve) employing arbitrary axis scales.

FIG. 4 illustrates a MOSFET structure 100 for use in an ESD protection device according to the present invention. MOSFET structure 100 includes a semiconductor substrate 102 (e.g., a silicon substrate) of a first conductivity type (typically P-type). The dopant level in the semiconductor substrate 102 can be any conventional level known in the art. MOSFET structure 100 also includes a gate insulation layer 104 on the semiconductor substrate 102 and a patterned gate layer 106 overlying the gate insulation layer 104. The gate insulation layer 104 is typically a gate silicon dioxide ($SiO_2$) layer, although other gate insulating layers known in the art can be employed.

Gate insulation layer 104 can be formed using conventional techniques, such as thermal oxidation. Patterned gate layer 106 can be formed of, for example, either amorphous silicon or polysilicon using conventional deposition and patterning techniques.

MOSFET structure 100 also includes a source region 108 and a drain region 110 of a second conductivity type (typically N-type) disposed in the semiconductor substrate 102 and an LDD source extension region 112 of the second conductivity type disposed in the semiconductor substrate adjacent to the source region 108.

The general characteristics of Lightly-Doped-Drain (LDD) extension regions are well known to one skilled in the art and will not be repeated here. However, section 5.6.5 of Stanley Wolf, *Silicon Processing for the VLSI Era, Volume 2—Process Integration*, 354–359 (Lattice Press, 1990), which is hereby fully incorporated by reference, provides a detailed description of LDD extension regions. While the width and net dopant level of the LDD source extension region 112 is technology dependent, a typical width is in the range of 0.5 microns to 4.0 microns.

MOSFET structure 100 further includes a channel region 114 of the first conductivity type disposed in the semiconductor substrate 102 underneath the gate insulation layer 104 and extending from the LDD source extension region 112 to the drain region 110. If desired, the MOSFET structure 100 can also include a gate sidewall spacer 116, which abuts the sides of patterned gate layer 106 and gate insulation layer 104. The gate sidewall spacer 116 can be made, for example, of CVD silicon nitride, silicon dioxide or combination of silicon nitride and silicon dioxide and have a typical width, measured at the bottom of the gate sidewall spacer, in the range of 500 angstroms to 1000 angstroms.

In MOSFET structures according to the present invention, the absence of a conventional LDD drain extension region and the sole presence of an LDD source extension region provides a MOSFET structure wherein the channel region directly connects the LDD source extension region to the drain region. Due to the absence of an LDD drain extension region, MOSFET structures according to the present invention have a relatively abrupt net dopant level profile at the junction (i.e., interface region) between the drain region and the channel region. This abrupt net dopant level profile provides for a lower first breakdown of this junction (i.e., a relatively low $V_{t1}$) under reverse bias conditions during an ESD event. Furthermore, the presence of an LDD source extension region provides for a relatively low source barrier to the forward biasing of the source region that occurs during an ESD event. The result is a MOSFET structure for use in ESD devices that exhibits both a relatively low first breakdown voltage and a relatively low holding voltage, in comparison to a conventional MOSFET structure that employs both an LDD source extension region and an LDD drain extension region with equivalent net dopant levels.

Figure 5:
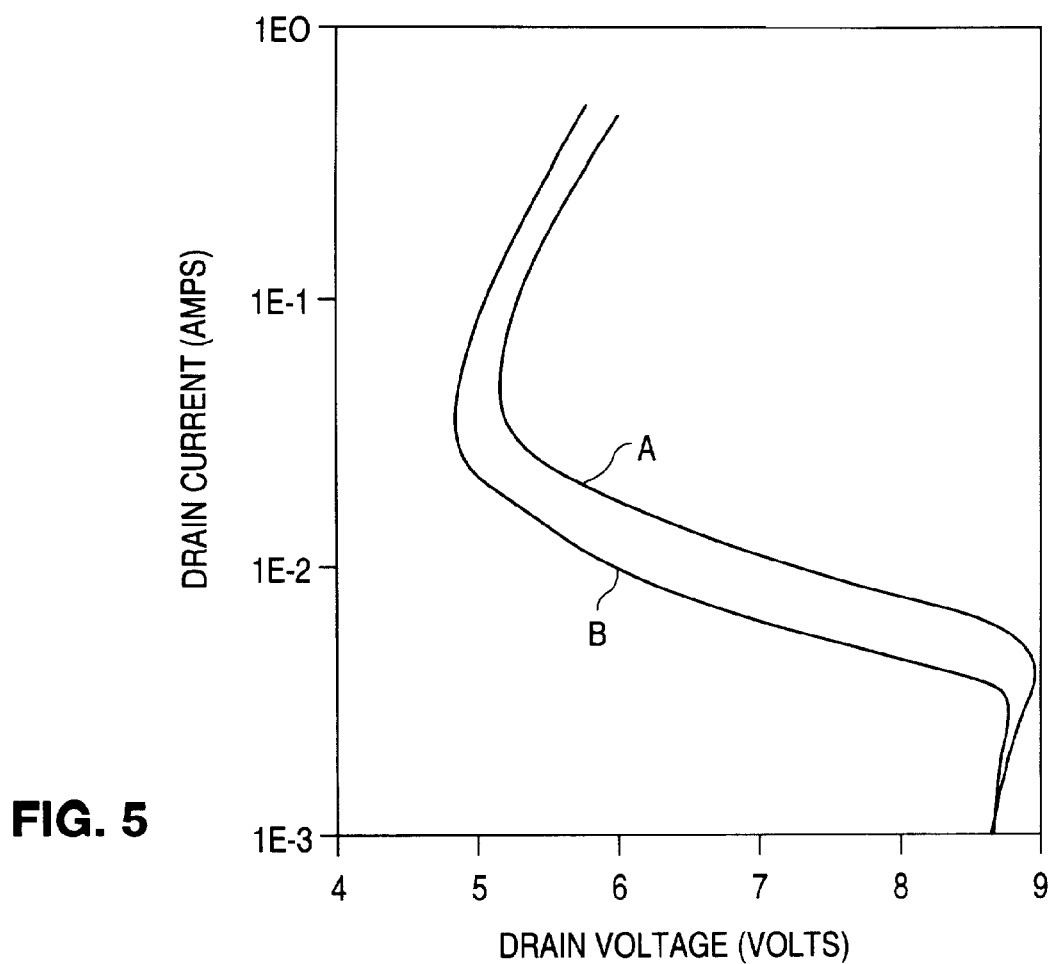
FIG. 5 shows the results of a computer simulation based on single 0.25 micron technology MOSFET structures that illustrates the difference in snap-back performance between a conventional MOSFET structure in a grounded-gate configuration and a MOSFET structure according to the present invention in a grounded-gate configuration.

The aforementioned characteristics of MOSFET structures according to the present invention are apparent from FIG. 5, which illustrates the results of a computer simulation based on single 0.25 micron technology MOSFET structures. FIG. 5 illustrates the difference in snap-back performance between a conventional MOSFET structure in a grounded-gate configuration (curve A) and a MOSFET structure according to the present invention in a grounded-gate configuration (curve B). The MOSFET structure for use in an ESD protection device according to the present invention has a lower first breakdown voltage (approximately 8.7 volts) than the conventional MOSFET structure (approximately 9.0 volts). In addition, curve B in FIG. 5 indicates that MOSFET structures for use in an ESD protection device according to the present invention will have a relatively low holding voltage. Hence, a MOSFET structure for use in an ESD protection device according to the present invention will have a greater ESD event survival expectancy (that is, a longer lifetime) than a conventional MOSFET structure.

MOSFET structures for use in ESD protection devices according to the present invention can be configured in any known configuration, including NMOSFET gate-coupled and NMOSFET gate-grounded configurations.

Figure 6:
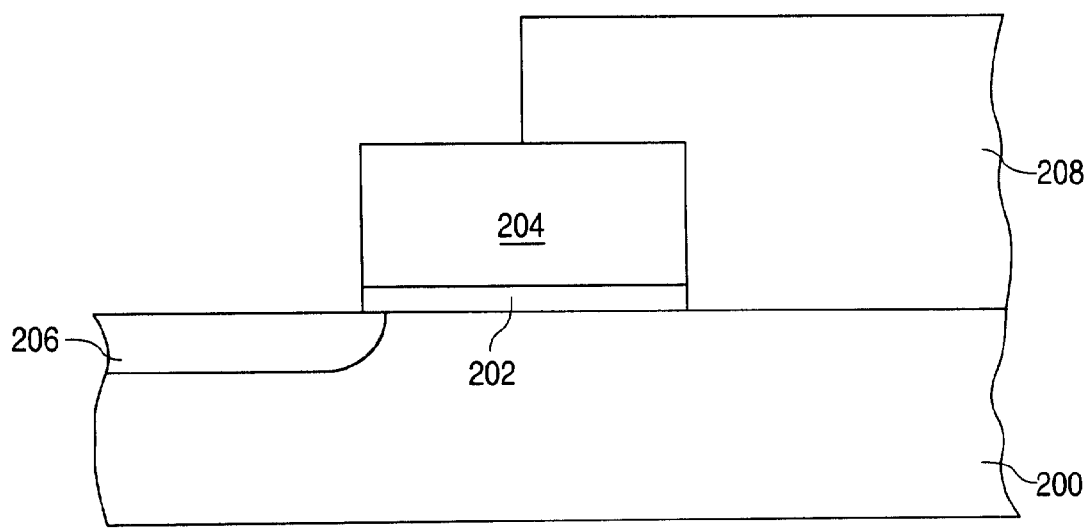
FIG. 6 is a cross-sectional view illustrating a stage in a process according to the present invention.

A MOSFET structure for use in an ESD protection device in accordance with the present invention can be manufactured, for example, by first providing a semiconductor substrate 200 with a gate insulation layer 202 thereon. Next, a patterned gate layer 204 (e.g., a patterned polysilicon layer formed using conventional techniques) is formed on the gate insulation layer 202. Dopant atoms are then implanted into the semiconductor substrate 200 to form an LDD source extension region 206, as illustrated in FIG. 6. The dopant atoms are implanted using an implant mask 208, such as a patterned photoresist mask, which prevents dopant atom implantation into those semiconductor substrate regions that will subsequently be adjacent to a drain region of the MOSFET structure. The dopant atoms can be implanted, for example, using an implantation technique with a dose in the range of 1E12 ions/cm$^2$ to 1E15 ions/cm$^2$, and energy in the range of 20 KeV to 40 KeV. A source region and a drain region can be subsequently formed using conventional techniques known in the art, including those techniques that employ gate sidewall spacers.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A MOSFET structure for use in an ESD protection device, the MOSFET structure comprising:
    a semiconductor substrate of a first conductivity type;
    a gate insulation layer disposed on the semiconductor substrate;
    a patterned gate layer overlying the gate insulation layer;
    a source region and a drain region of a second conductivity type in the semiconductor substrate;
    an LDD source extension region of the second conductivity type disposed in the semiconductor substrate adjacent to the source region; and
    a channel region of the first conductivity type disposed in the semiconductor substrate underneath the gate insulation layer and extending from the LDD source extension region to the drain region,
    whereby the absence of a LDD drain extension region and the presence of an LDD source extension region provides a relatively low first breakdown voltage and a relatively low holding voltage.

2. The MOSFET structure of claim 1, wherein the first conductivity type is P-type and the second conductivity type is N-type.

3. The MOSFET structure of claim 1, wherein the gate insulation layer is a gate silicon dioxide layer and the patterned gate layer is a patterned polysilicon gate layer.

4. The MOSFET structure of claim 1, wherein the LDD source extension region is formed using a dopant implantation technique with a dose in the range of 1E12 ions/cm$^2$ to 1E15 ions/cm$^2$ and energy in the range of 20 KeV to 40 KeV.

5. The MOSFET structure of claim 4, wherein the second conductivity type is N-type and the LDD source extension region is formed using a phosphorus dopant implantation technique.

6. The MOSFET structure of claim 1, wherein the width of the LDD source extension region is in the range of 0.5 microns to 2.0 microns.

7. The MOSFET structure of claim 1, wherein the MOSFET structure is an NMOSFET structure employed in an ESD protection device in a grounded-gate configuration.

8. The MOSFET structure of claim 1, wherein the MOSFET structure is an NMOSFET structure employed in an ESD protection device in a coupled-gate configuration.

9. An ESD protection device comprising:
    a grounded-gate MOSFET including:
        a semiconductor substrate of a first conductivity type;
        a gate insulation layer disposed on the semiconductor substrate;
        a patterned gate layer overlying the gate insulation layer;
        a source region and a drain region of a second conductivity type in the semiconductor substrate;
        an LDD source extension region of the second conductivity type disposed in the semiconductor substrate adjacent to the source region; and
        a channel region of the first conductivity type disposed in the semiconductor substrate underneath the gate insulation layer and extending from the LDD source extension region to the drain region,
        whereby the absence of a LDD drain extension region and the presence of an LDD source extension region provides a relatively low first breakdown voltage and a relatively low holding voltage.

10. An ESD protection device formed in a semiconductor material of a first conductivity type, the semiconductor material having a surface, the device comprising:
    a first source region of a second conductivity type formed in the semiconductor material, the first source region having a first dopant concentration;
    a second source region of the second conductivity type formed in the semiconductor material, the second source region contacting the first source region and having a second dopant concentration that is less than the first dopant concentration;
    a drain region of the second conductivity type formed in the semiconductor material a distance apart from the first and second source regions, the drain region having the first dopant concentration, not having a region of the second dopant concentration, and not contacting a region of the second dopant concentration;

a channel region defined in the semiconductor material between the second source region and the drain region, the channel region contacting the second source region and the drain region;

a layer of oxide formed over the channel region; and a gate formed on the layer of oxide over the channel region.

11. The ESD protection device of claim 10 wherein the channel region contacts the drain region at the surface.

12. The ESD protection device of claim 11 and further comprising a side wall spacer formed on the surface to adjoin the gate.

13. The ESD protection device of claim 11 wherein the channel region contacts the first source region.

14. The ESD protection device of claim 11 wherein the gate is grounded.

* * * * *